US009105779B2

(12) United States Patent
Deligianni et al.

(10) Patent No.: US 9,105,779 B2
(45) Date of Patent: Aug. 11, 2015

(54) METHOD OF FABRICATING A FLEXIBLE PHOTOVOLTAIC FILM CELL WITH AN IRON DIFFUSION BARRIER LAYER

(75) Inventors: Hariklia Deligianni, Tenafly, NJ (US); Lian Guo, Yorktown, NY (US); Marinus Johannes Petrus Hopstaken, Carmel, NY (US); Maurice Mason, Yorktown, NY (US); Lubomyr T Romankiw, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 249 days.

(21) Appl. No.: 13/245,016

(22) Filed: Sep. 26, 2011

(65) Prior Publication Data

US 2013/0074915 A1   Mar. 28, 2013

(51) Int. Cl.
*H01L 31/0392* (2006.01)
*H01L 31/0749* (2012.01)
*H01L 31/032* (2006.01)

(52) U.S. Cl.
CPC ...... *H01L 31/03928* (2013.01); *H01L 31/0322* (2013.01); *H01L 31/0749* (2013.01); *Y02E 10/541* (2013.01)

(58) Field of Classification Search
USPC ........................................................ 136/262
See application file for complete search history.

(56) References Cited

U.S. PATENT DOCUMENTS

| 7,838,403 B1 | 11/2010 | Liu et al. |
| 7,875,945 B2 | 1/2011 | Krasnov et al. |
| 2003/0116439 A1 | 6/2003 | Seo et al. |
| 2007/0295389 A1 | 12/2007 | Capps et al. |
| 2008/0308148 A1 | 12/2008 | Liedholm et al. |
| 2010/0051105 A1* | 3/2010 | Pinarbasi ...................... 136/262 |
| 2010/0224249 A1 | 9/2010 | Fukunaga et al. |
| 2011/0108115 A1 | 5/2011 | Deligianni et al. |
| 2011/0124191 A1* | 5/2011 | Wirth ............................ 438/653 |

FOREIGN PATENT DOCUMENTS

| WO | WO 2006/138362 | 12/2006 |
| WO | WO 2010/138766 | 2/2010 |

OTHER PUBLICATIONS

J. H. Yun et al., "Effect of Na=Doped Mo/Mo Bilayer on CIGS Cells and Its Photovoltaic Properties," Photovoltaic Energy Conversion. Conference Record of the 2006 IEEE 4th World Conference on Photovoltaic Energy Conversion, vol. 1, May 2006, pp. 509-511.

(Continued)

*Primary Examiner* — Jennifer Michener
*Assistant Examiner* — Dustin Q Dam
(74) *Attorney, Agent, or Firm* — Vazken Alexanian

(57) ABSTRACT

A method of fabricating a flexible photovoltaic film cell with an iron diffusion barrier layer. The method includes: providing a foil substrate including iron; forming an iron diffusion barrier layer on the foil substrate, where the iron diffusion barrier layer prevents the iron from diffusing; forming an electrode layer on the iron diffusion barrier layer; and forming at least one light absorber layer on the electrode layer. A flexible photovoltaic film cell is also provided, which cell includes: a foil substrate including iron; an iron diffusion barrier layer formed on the foil substrate to prevent the iron from diffusing; an electrode layer formed on the iron diffusion barrier layer; and at least one light absorber layer formed on the electrode layer.

16 Claims, 4 Drawing Sheets

(56) References Cited

OTHER PUBLICATIONS

J.J. Schacham-Diamond et al., "Electroless Co(W.P) and Co(Mo.P) Deposition for Cu Metallization Applications," Proceedings of the 6th International Conference on Solid State Integrated-Circuit Technology, 2001, vol. 1, pp. 410-415.

Ling et al., "Electroless N:MoP Thin Film Deposition on Si-SiO2," 8th International Conference on Electronic Packaging Technology, 2007.

Daly et al., "Electrochemical nickel—phosphorus alloy formation" International Materials Reviews 2003 vol. 48 No. 5, pp. 326-338.

Paunovic et al., "Electrical Resistance and Stress of Bilayer Co(P)/Cu and Ni(P)/Cu Thin Films," J. Electrochem. Soc., vol. 140, No. 9, Sep. 1993.

* cited by examiner

METHOD OF FABRICATING A FLEXIBLE PHOTOVOLTAIC FILM CELL WITH AN IRON DIFFUSION BARRIER LAYER

BACKGROUND OF THE INVENTION

The present invention relates to photovoltaic devices, and more particularly the present invention is related to a flexible photovoltaic film cell with an iron diffusion barrier layer.

Today, Stainless steel foils and copper foils have been identified as potential flexible photovoltaic substrates for CIGS/CZTS. However, the past flexible photovoltaic film cells have significantly lower light conversion efficiency, because iron in stainless steel tends to diffuse up into the light absorber layer and interfere with the light absorber layer.

SUMMARY OF THE INVENTION

Accordingly, one aspect of the present invention provides a method of fabricating a flexible photovoltaic film cell with an iron diffusion barrier layer, the method including the steps of: providing a foil substrate including iron; forming an iron diffusion barrier layer on the foil substrate, where the iron diffusion barrier layer prevents the iron from diffusing; forming an electrode layer on the iron diffusion barrier layer; and forming at least one light absorber layer on the electrode layer.

Another aspect of the present invention provides a flexible photovoltaic film cell, including: a foil substrate comprising iron; an iron diffusion barrier layer formed on the foil substrate, where the iron diffusion barrier layer prevents the iron from diffusing; an electrode layer formed on the iron diffusion barrier layer; and at least one light absorber layer formed on the electrode layer.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF THE PREFERRED EMBODIMENTS

The above and other features of the present invention will become more distinct by a detailed description of embodiments shown in combination with attached drawings. Identical reference numbers represent the same or similar parts in the attached drawings of the invention.

Flexible photovoltaics (FPV) have many advantages over conventional Photovoltaics (PV) which are fabricated on rigid, heavy, and fragile glass substrates. FPVs use thin metal foils which is light but more robust—only a few kilogram for solar panels of tens of square meters, and hard to break. Furthermore, because of their flexibility, they can be not only incorporated onto building sectors, but also on automobile sectors and consumable electronics sectors, therefore open up avenue for new applications of PV devices.

Stainless steel foils and copper foils have been identified as potential FPV substrates for CIGS/CZTS light absorber layers, because stainless steel foils and copper foils have matching thermal expansion coefficients to CIGS/CZTS and good corrosion resistance. However, iron in stainless steel tends to diffuse up into the light absorber layer, dramatically lowering the light conversion efficiency. In addition, copper up-diffusion can also change the chemical composition of CIGS/CZTS, resulting in rapid aging of solar devices. The current solution to prevent the diffusion of detrimental elements from substrate is to coat the metal foil with a barrier layer. The barrier layer materials adopted so far include refractory metals and oxides such as Ti, Ta, and SiO2, but these refractory materials have limited effect in preventing iron from diffusing up into the light absorber layer.

A detailed description of a method and apparatus for fabricating a flexible photovoltaic film cell as provided by an embodiment of the present invention is made with reference to attached drawings.

Figure 1:
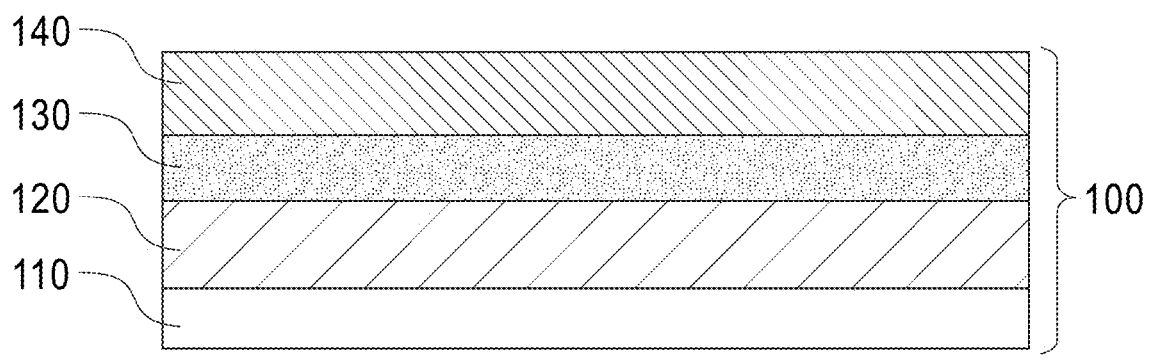
FIG. 1 shows a structure of a flexible photovoltaic film cell with an iron diffusion barrier layer according to an embodiment of the invention.

FIG. 1 illustrates a flexible photovoltaic film cell that forms a flexible photovoltaic device 100 including an iron diffusion barrier layer, according to an embodiment of the invention. For example, the solar cell 100 can be formed according to method shown in FIG. 2. The thin film solar cell 100 also includes Copper indium gallium di-selenide (CIGS), which is a semiconductor light absorbing material having a direct bandgap. The term CIGS (CuInxGa(1-x)Se2), which will be explained in detail later, is a compound included of copper, indium, and either or both of gallium and selenium. In the broad sense, at one extreme CIGS can be the compound CIS that does not include gallium (X=1); at the other extreme CIGS can be the compound CGS that does not include indium (X=0); or CIGS can be a compound containing all of the elements: copper, indium, gallium and selenium (X is between 0 and 1, but not including 0 and 1). Also, CIGS (CuInxGa(1-x)Se2) has a bandgap varying continuously with X from about 1.0 eV (electron volts) at 300 K (degrees Kelvin) for CIS (X=1), to about 1.7 eV at 300 K for CGS (X=0).

The flexible photovoltaic film cell includes a substrate 110, an iron diffusion barrier layer 120, an electrode layer 130, and a light absorber layer 140. The substrate 110 is an iron foil layer upon or above which the other layers of the cell 100 are formed. The iron foil substrate can provide mechanical support for cell 100. In addition to the mechanical support, an iron foil substrate can provide corrosion resistance, flexibility, lower production costs and durability. The iron foil substrate can have a thickness of about 0.14 millimeters (mm). Other exemplary substrates include stainless steel foil and other foil substrates.

Iron diffusion barrier layer 120 is a layer formed on the foil substrate 110. Iron diffusion barrier layer 120 includes a material that has metallic species and a non-metallic species, and can include nickel-phosphorus (NiP). Iron diffusion barrier layer in the embodiment of the present invention has a thickness from 50 nm to 1000 nm, depending on the barrier diffusion properties, which can be affected by chemical composition of phospher in NiP barrier layer, as well as the processing temperature.

A back contact electrode layer 130 is a layer formed upon the iron diffusion barrier layer that was annealed on the substrate 110. The back electrode layer 130 typically includes a metal and can include, for example, molybdenum (Mo). Alternately or additionally, the back contact 130 can include a semiconductor. The back contact 130 is an electrical contact that provides back-side electrical contact to provide current from the flexible photovoltaic film cell 100. An Exemplary back contact 130 is a layer having a thickness from about 0.5 micron to about 1 micron.

Light absorber layer 140 includes CIGS, and can be, for example, about 1 to about 2 microns thick. The CIGS included within light absorber layer 140 can be, for example, nanocrystalline (microcrystalline) or polycrystalline and can be formed p-type, for example, formed p-type from intrinsic defects within the CIGS. Nanocrystalline and polycrystalline CIGS both include crystalline grains, but differ in, for example, the grain size of the crystalline grains. Alternately or additionally, the CIGS can be formed p-type by intentional inclusion (e.g., doping) of a p-type dopant (i.e., an additional material introduced into the CIGS in very small concentrations to make the CIGS semiconductor p-type or more p-type). The light absorber layer 140 can also include, alternatively, an approximately 0.7 microns thick layer of n-type CdS. The light absorber layer 140 is formed upon and abuts or is proximate to the electrode layer 130.

Figure 2:
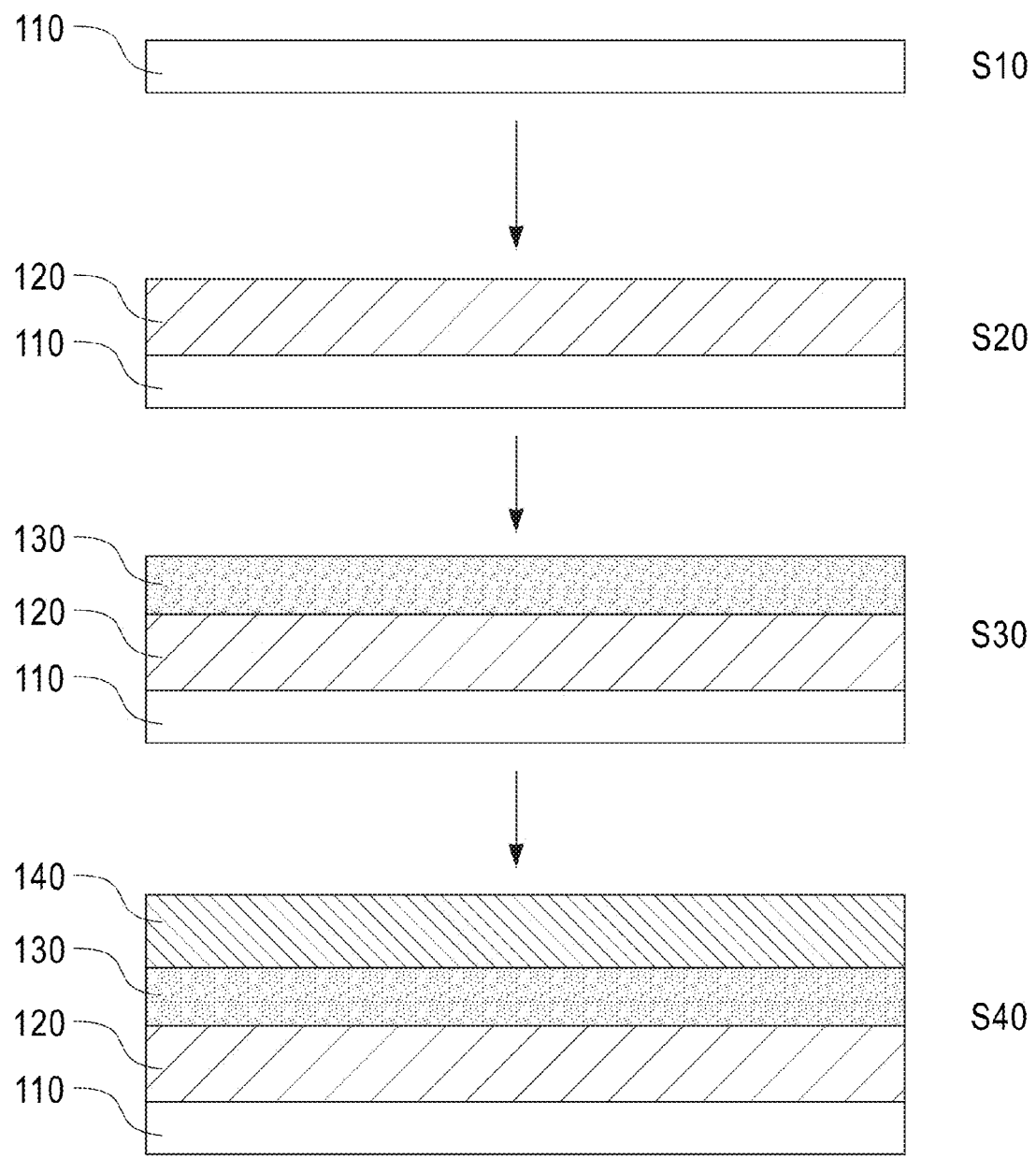
FIG. 2 shows a schematic diagram of a method for producing a flexible photovoltaic film cell with an iron diffusion barrier layer according to an embodiment of the invention.

FIG. 2 shows a schematic diagram of a method for producing a flexible photovoltaic film cell with an iron diffusion barrier layer according to an embodiment of the invention. In step S10 of FIG. 2, an iron foil substrate 110 is provided. Foil substrate 110 can contain iron only, or iron and chromium. In an embodiment of the present invention, foil substrate contains 5 atom percent to 30 atom percent chromium. 16.5% percent chromium stainless foil substrate can be preferred, because its coefficient of thermal expansion (CTE) matches with those of preferred absorber layer materials such as CIGS as well as superior corrosion resistance. Another steel foil, nickel chromium steel foil has higher CTE than chromium stainless foil. For example, high Chromium Stainless Steel (SS) foil consisting of 84% Fe and 16% Cr of thickness 0.14 mm can be selected as the flexible substrate because its coefficient of thermal expansion (CTE) is close to that of CIGS/CZTS. Foil substrate 110 can be manufacture through cold forming by all standard process (bending, contour forming, drawing, flow turning etc.), and can be cleaned with organic solvents in an ultrasonic bath to remove oil residues from rolling.

In step S20 of FIG. 2, iron diffusion barrier layer 120 is formed on the foil substrate. Iron diffusion barrier layer in the embodiment of the present invention has a thickness from 50 nm to 1000 nm, depending on the barrier diffusion properties, which can be affected by chemical composition of phospher in NiP barrier layer, as well as the processing temperature. Iron diffusion barrier layer 120 includes a material that has metallic species and a non-metallic species. The metallic species consist of one or more elements in Group VIA including Mo and W, in group VIIIB including Ni, Co and Fe, as well as Zn. Sn and Sb. The non-metallic species consist of one element in B, P, S, Se and Te. To be more specific, typical binary compounds include NiP/B, CoP/B, MoP/B, MoSe2 and MoS2, and typical ternary compounds includes NiMoP/B, CoMoP/B, NiWP/B and CoWP/B. The iron diffusion barrier layer can be formed by spinning, spraying, anodization, electroless deposition, electrodeposition, vacuum deposition, and vapor deposition. Iron diffusion barrier layer 120 can be annealed on the foil substrate at a range from 400° C. to 600° C. in nitrogen gas atmosphere to improve the adhesion of the iron diffusion barrier layer on the foil substrate.

Referring to step S20 of FIG. 2, barrier layer materials can be electroplated in aqueous solution and demonstrate their barrier property on metal foils. Deposition of nickel-phosphorus (NiP) with an electroless solution have some properties that are superior to those of electrolytically formed NiP, because the electrolessly deposited NiP can be controlled to have specific phosphorus content. Electrolessly deposited NiP is harder, has great corrosion resistance, and has uniform surface coverage due to the control of the phosphorus. Furthermore, without the costly equipment and energy to sustain a vacuum environment, solution-based electroplating is considered as a low-cost method for thin-film fabrication. Thus, electroplated diffusion barrier solves the problem of FPV without introducing significant extra cost compared to vacuum process, which leads to the high final cost of flexible solar panels. (see Daly et al., "Electrochemical nickel-phosphorus alloy formation" *International Materials Reviews* 2003 *Vol.* 48 *No.* 5, pp. 326-338).

NiP of thickness about 300 nm can be electrolessly formed on the SS using commercial electroless plating bath (Technic EN 8200). A preferred amount percentage of P in the NiP barrier is around 12%. The deposition rate is approximately 200 nm per minute, resulting in less than two minutes processing time. The as-formed NiP film is then soft-annealed at 200° C. for 30 minutes in nitrogen atmosphere to improve adhesion. The temperature of the annealing is preferred to be kept at 200° C., for 30 minutes because there may be structural changes of NiP if it is annealed beyond the preferred temperature and time. (see Paunovic et al., "Electrical Resistance and Stress of Bilayer Co(P)/Cu and Ni(P)/Cu Thin Films," *J. Electrochem. Soc.*, Vol. 140, No. 9, September 199). In the embodiment of the present invention, however, the NiP will survive high temperatures due to NiP layer's thickness.

Figure 3:
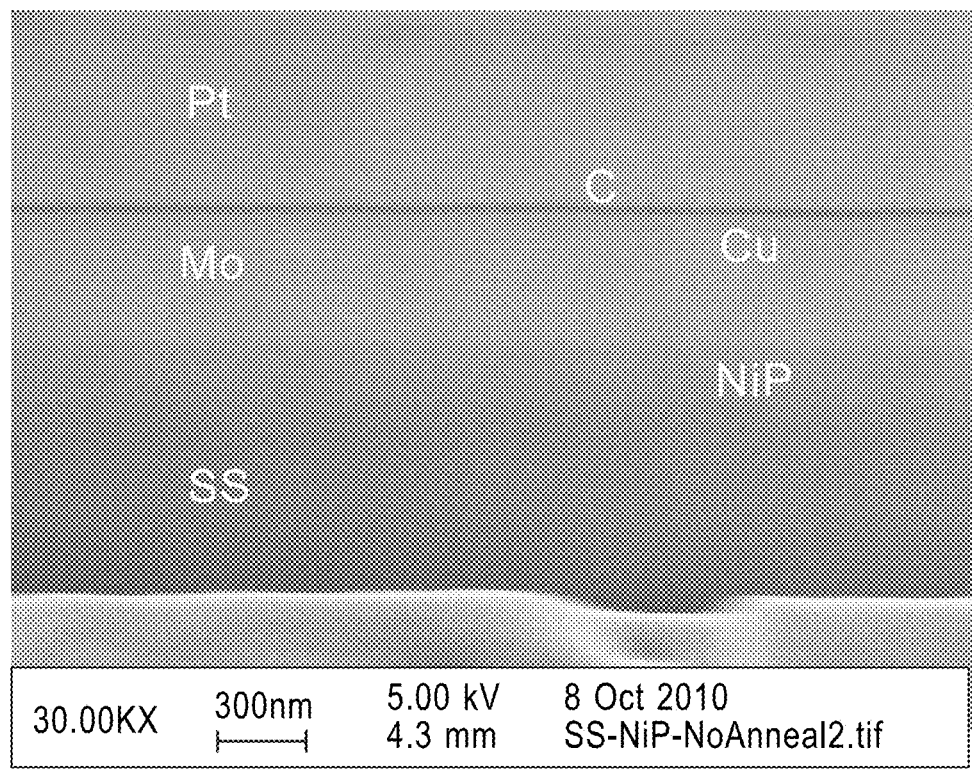
FIG. 3 shows a cross section image of a flexible photovoltaic film cell with an iron diffusion barrier layer under scanning electron microscope according to an embodiment of the invention.

Referring again to step S20 of FIG. 3, an iron diffusion barrier layer can alternatively be formed by electrolytic pulse deposition from a bath containing 0.11 M NiSO4, 0.17M NaH2PO2, 0.12M sodium acetate and 0.3 mM SDS (C12H25O4S—Na) with pH=4.4. The pulse deposition consists of two types of pulses: one is at 50 mA/cm2, 500 Hz for 10 s, the other is at 10 mA/cm2, 1 Hz for 10 minutes. This method leads to higher P content as shown in Table 1. NiP film with higher P content can suppress the Fe diffusion more effectively.

TABLE 1

| Chemical composition and thickness of pulse electroformed NiP thin film | | | |
|---|---|---|---|
| Sample | [Ni] at. % | [P] at. % | t (Å) |
| SS1110E | 73.4 ± 2 | 26.6 ± 2 | 3188 ± 200 |
| SS1110B | 74.4 ± 2 | 25.6 ± 2 | 2328 ± 200 |

In step S30 of FIG. 2, a back contact electrode layer 130 is formed on iron diffusion barrier layer 120. Electrode layer 130 is a back contact layer, and is 600 nm thick. Electrode layer 130 includes compounds such as molybdenum. Molybdenum compound is preferred due to its widely application as a back contact material in CIGS/CZTS solar cells, because it forms a good Ohmic contact with the absorber layer. Molybdenum electrodes have low stress, high conductivity, and good adhesion to the rear substrate. To provide this combination of features, oxygen is introduced into the molybdenum electrode at the initial stage of deposition on the substrate. The application of the oxygen reduces the overall stress of the rear electrode. (see U.S. Pat. No. 7,875,945 B2, published on Jan. 25, 2011) The electrode layer is sputtered on the diffusion barrier layer 120.

In step S40 of FIG. 2, a light absorber layer 140 is formed on electrode layer 130. Light absorber layer 140. Light absorber layer uses thin-film technology, which includes direct bandgap materials, such as amorphous Si, cadmium telluride (CdTe) and copper indium gallium selenide (CuInGaSe$_2$ also commonly abbreviated as "GIGS"). Direct bandgap absorbers have strong light absorption at a thickness of only a few micrometers. Reduced thickness means reduced material and production costs.

A bandgap (also called an energy gap) of a material, is an energy range of the material where no electron states exist. For insulators and semiconductors, the bandgap generally refers to the energy difference between the top of the valence band of the material and the bottom of the conduction band of the material. The bandgap is the amount of energy required to free an outer-shell electron from its orbit about the nucleus to a free state. Bandgaps are usually expressed in electron volts.

Copper indium gallium di-selenide (CIGS) is an I-III-VI$_2$, compound semiconductor material (e.g., a p-type semiconductor material). CIGS is also known as copper indium gallium selenide. In the broad sense, CIGS, as used herein, indicates a compound comprised of copper, indium, and either or both of gallium and selenium. That is, CIGS may be the compound CIS, the compound CGS or a compound containing all the elements copper, indium, gallium and selenium. CIGS may be a solid solution of the constituent elements of CIGS. CIGS has a chemical formula of $CuIn_xGa_{(1-x)}Se_2$, where the value of X can vary from 1 to 0. CIGS is a tetrahedrally-bonded semiconductor, with a chalcopyrite crystal structure, and a bandgap varying continuously with X from about 1.0 eV (electron volts) at 300 K (degrees Kelvin) for CIS, to about 1.7 eV at 300 K for CGS.

Of the three above-mentioned thin-film materials, CIGS is a preferred material for the light absorber layer 140. CIGS-based photovoltaic devices with an efficiency of as high as 19.5 percent (%) have been demonstrated (as compared with 16.5% and 12% efficiencies for CdTe and amorphous Si absorbers, respectively). In addition, in CIGS there is no toxic cadmium (Cd) involved as with CdTe, and there are no degradation issues as with amorphous Si. (See U.S. Pat. No. 7,838,403 B1, published on Nov. 23, 2010). Furthermore, It is preferred for light absorber layer 140 to include copper indium gallium selenide (CIGS), copper zinc tin sulfide (CZTS), and/or Cadmium Sulfide (CdS), because their high light absorption coefficients and satisfactory long-term stability.

Very-high-efficiency CIGS absorber layers have been achieved using vacuum-based deposition processes, such as the "three-stage process" adopted by the National Renewable Energy Lab (NREL) which is a vacuum co-evaporation process wherein individual metal sources of copper (Cu), indium (In), gallium (Ga) and selenium (Se) are evaporated toward a heated substrate. The carefully controlled metal fluxes deliver a desired amount of metals, which react at the substrate under an overpressure of Se and form the CIGS compound. (See U.S. Pat. No. 7,838,403 B1, published on Nov. 23, 2010). Light absorber layer 140 can be annealed onto the electrode layer at a range of 400° C. and 600° C.

Some of the other solution-based approaches include solution-based deposition, electrodeposition, spray processes, doctor blading, ink jet printing and spin-coating. Spray processes, in particular, offer high throughput and high material utilization, and can be used to produce large-area uniform thin films with good adhesion to the substrate. Deposition of chalcopyrite materials, such as, copper indium disulfide (CuInS$_2$) and copper indium diselenide (CuInSe$_2$), which is commonly abbreviated as "CIS," have been demonstrated using this method.

After other approaches, light absorber layer 140 can be annealed onto the electrode layer at a range of 400° C. and 600° C.

FIG. 3 shows an image of a flexible photovoltaic film cell with an iron diffusion barrier layer under scanning electron microscope. Referring to FIG. 3, the stack of the films Cu (80 nm)/Mo (600 nm)/NiP (300 nm)/SS is clearly shown in the scanning electron microscope (SEM) cross-section image. In the image, iron diffusion barrier layer is compact and uniform, conformally coating the Stainless Steel substrate. The cross-section image of the embodiment of the present invention shows as-formed multi-layer structure, highlighting the continuous dense iron diffusion barrier layer between the back contact Mo layer and the stainless steel substrate.

Figure 4A:
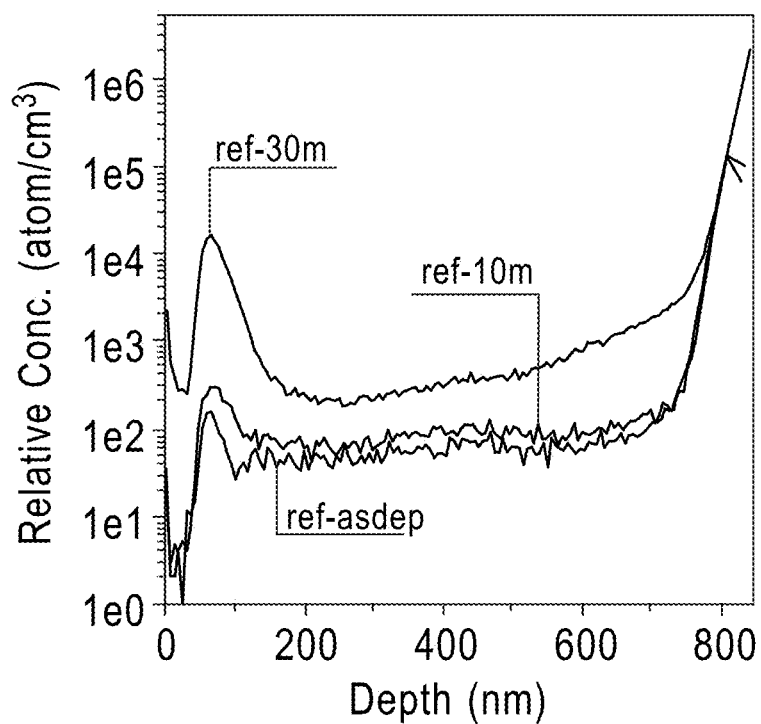
FIG. 4A shows a depth profiling graph of iron in a flexible photovoltaic film cell with an iron diffusion barrier layer during an annealing process according to an embodiment of the invention.

FIG. 4A shows a depth profiling graph of iron in a flexible photovoltaic film cell with an iron diffusion barrier layer during an annealing process according to an embodiment of the invention. As can be seen from FIG. 4A, there is no observable increase of Ni content in the whole Mo layer after 30 minutes annealing at 600° C.

Figure 4B:
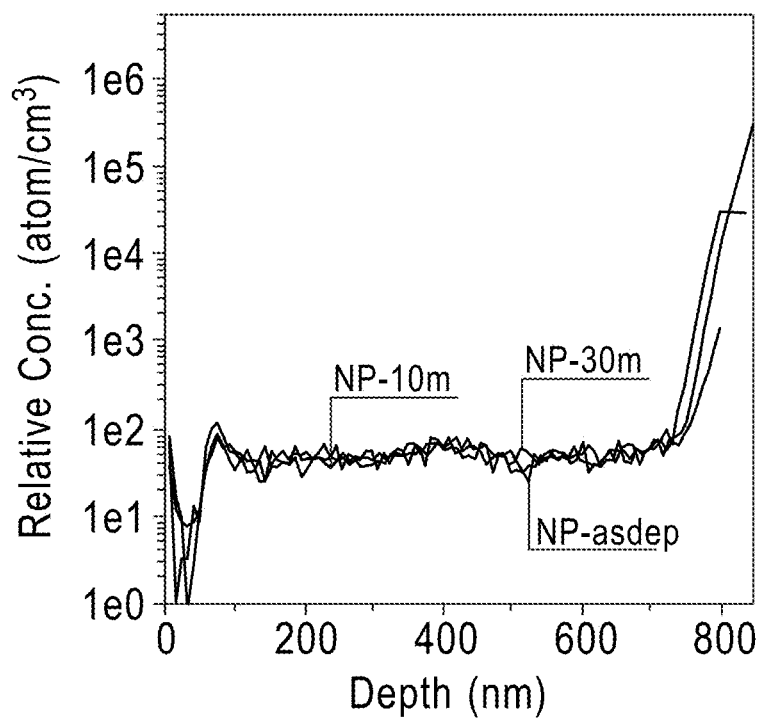
FIG. 4B shows a depth profiling graph of iron in a flexible photovoltaic film cell without an iron diffusion barrier layer during an annealing process according to an embodiment of the invention.

On the other hand, FIG. 4B shows a depth profiling graph of iron in a flexible photovoltaic film cell without an iron diffusion barrier layer during an annealing process according to an embodiment of the invention. As can be seen from FIG. 4B, Ni contents significantly increase after 30 minutes annealing at 600° C. across the whole Mo layer, especially near the Cu/Mo interface.

It is to be understood that the sequence between the process steps shown in the accompanying figures and described herein can differ depending on the manner in which the present invention is used to create a final product such as a photovoltaic thin film structure. Given the teachings of the present invention, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. Thus, alternative embodiments that are not presented herein regarding a specific portion of the invention or further alternatives that may be available but are not described herein should not be considered to be a disclaimer of those alternate embodiments. Other applications and embodiments can be implemented without departing from the spirit and scope of the present invention.

It is therefore intended that the present invention not be limited to the specific embodiments described herein, because numerous permutations and combinations of the above and implementations involving non-inventive substitutions for the above can be created, but the invention is to be defined in accordance with the claims that follow. It can be appreciated that many such embodiments are within the literal scope of the appended claims and that others are equivalents thereto.

What is claimed is:

1. A method of fabricating a flexible photovoltaic film cell with an iron diffusion barrier layer, the method comprising the steps of:
   providing a foil substrate comprising iron;
   forming an iron diffusion barrier layer on said foil substrate, wherein said iron diffusion barrier layer prevents said iron from diffusing to at least one light absorber layer, and wherein the iron diffusion barrier layer comprises a chemical compound selected from a group consisting of: nickel phosphorus (NiP), cobalt-boron (CoB), cobalt tungsten boride (CoWB), and any combinations thereof;
   forming an electrode layer on said iron diffusion barrier layer; and
   forming at least one light absorber layer on said electrode layer.

2. The method according to claim 1, wherein said step of forming an iron diffusion barrier layer comprises a technique selected from the group consisting of spinning, spraying, anodization, electroless deposition, electrodeposition, vacuum deposition, and vapor deposition.

3. The method according to claim 1, wherein said iron diffusion barrier layer has a thickness from 50 nm to 1000 nm.

4. The method according to claim 1, wherein said step of forming an iron diffusion barrier layer further comprises:
   annealing said iron diffusion barrier layer onto said foil substrate at a range from 400° C. to 600° C., wherein said step of annealing on said diffusion layer improves adhesion of said iron diffusion barrier layer on said foil substrate.

5. The method according to claim 1, wherein said step of forming at least one light absorber layer on said electrode layer further comprises:
   annealing said light absorber layer onto said electrode layer at a range from 400° C. to 600° C., wherein said step of annealing on said light absorber layer improves adhesion of said light absorber layer on said electrode layer.

6. The method according to claim 1, wherein said foil substrate further comprises chromium, wherein said foil substrate contains 5 atom percent to 30 atom percent chromium.

7. The method according to claim 1, wherein said light absorber layer is a layer selected from a group consisting of copper indium gallium selenide (CIGS) and copper zinc tin sulfide (CZTS), Cadmium Sulfide (CdS), and combinations thereof.

8. The method according to claim 1, wherein said electrode layer comprises molybdenum.

9. A flexible photovoltaic film cell, comprising:
   a foil substrate comprising iron;
   an iron diffusion barrier layer formed on said foil substrate, wherein said iron diffusion barrier layer prevents said iron from diffusing to at least one light absorber layer, and wherein said iron diffusion barrier layer comprises a chemical compound selected from a group consisting of: nickel-phophorus (NiP), cobalt-boron (CoB), cobalt tungsten boride (CoWB), and any combinations thereof;
   an electrode layer formed on said iron diffusion barrier layer; and
   at least one light absorber layer formed on said electrode layer.

10. The method according to claim 9, wherein said iron diffusion barrier layer is formed by a technique selected from the group consisting of spinning, spraying, anodization, electroless deposition, electrodeposition, vacuum deposition, and vapor deposition.

11. The film cell according to claim 9, wherein said iron diffusion barrier layer has a thickness from 50 nm to 1000 nm.

12. The film cell according to claim 9, wherein said iron diffusion barrier layer is annealed onto said foil substrate at a range of 400° C. and 600° C.

13. The film cell according to claim 9, wherein said light absorber layer is annealed onto said electrode layer at a range of 400° C. and 600° C.

14. The film cell according to claim 9, wherein said foil substrate further comprises chromium, wherein said foil substrate contains 5 atom percent to 30 atom percent chromium.

15. The film cell according to claim 9, wherein said light absorber layer is a layer selected from a group consisting of copper indium gallium selenide (CIGS), copper zinc tin sulfide (CZTS), Cadmium Sulfide (CdS), and combinations thereof.

16. The film cell according to claim 9, wherein said electrode layer comprises molybdenum.

* * * * *